(12) United States Patent
Kim et al.

(10) Patent No.: US 10,042,726 B2
(45) Date of Patent: *Aug. 7, 2018

(54) DATA BUFFER SPARE ARCHITECTURES FOR DUAL CHANNEL SERIAL INTERFACE MEMORIES

(71) Applicant: INTERNATIONAL BUSINESS MACHINES CORPORATION, Armonk, NY (US)

(72) Inventors: Kyu-Hyoun Kim, Chappaqua, NY (US); Warren E. Maule, Cedar Park, TX (US); Kevin M. Mcilvain, Delmar, NY (US); Saravanan Sethuraman, Bangalore (IN)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/841,798

(22) Filed: Dec. 14, 2017

(65) Prior Publication Data

US 2018/0150369 A1    May 31, 2018

Related U.S. Application Data

(63) Continuation of application No. 15/363,163, filed on Nov. 29, 2016.

(51) Int. Cl.
*G11C 7/10* (2006.01)
*G06F 11/20* (2006.01)

(52) U.S. Cl.
CPC .... *G06F 11/2094* (2013.01); *G06F 2201/805* (2013.01)

(58) Field of Classification Search
CPC .......................... G06F 11/106; G06F 13/1684
USPC ......... 711/E12.001, 154; 365/189.02, 189.05
See application file for complete search history.

(56) References Cited

U.S. PATENT DOCUMENTS

| | | |
|---|---|---|
| 2010/0162037 A1 | 6/2010 | Maule et al. |
| 2013/0132779 A1 | 5/2013 | Smith et al. |
| 2014/0063987 A1 | 3/2014 | Cordero et al. |

*Primary Examiner* — Thong Q Le
(74) *Attorney, Agent, or Firm* — Cantor Colburn LLP; Bryan Bortnick

(57) ABSTRACT

Examples of techniques for implementing a spare data buffer in a memory are disclosed. In one example implementation according to aspects of the present disclosure, a computer-implemented method may include detecting, by a processor, a failed data buffer in a memory. The method may also include enabling, by the processor, the spare data buffer in the memory. The method may further include extending, by the processor, a buffer communication to the spare data buffer to enable the spare buffer to functionally replace the failed data buffer.

1 Claim, 4 Drawing Sheets

DATA BUFFER SPARE ARCHITECTURES FOR DUAL CHANNEL SERIAL INTERFACE MEMORIES

DOMESTIC PRIORITY

This application is a continuation of U.S. patent application Ser. No. 15/363,163, entitled "DATA BUFFER SPARE ARCHITECTURES FOR DUAL CHANNEL SERIAL INTERFACE MEMORIES," filed Nov. 29, 2016, the disclosure of which is incorporated by reference herein in its entirety.

BACKGROUND

The present disclosure generally relates to memory for processing systems and, more particularly, relates to data buffer spare architectures for dual channel serial interface memory.

Memory, such as dual in-line memory modules (DIMM), may utilize data buffers to temporarily store data as it is being moved from one place to another. For example, data may be stored in a memory buffer as it is retrieved from an input device or as it is being prepared to be sent to an output device. In other examples, data buffers may be used when moving data between processes. The data buffers may be implemented in a fixed memory location in hardware, such as on a DIMM.

SUMMARY

According to examples of the present disclosure, techniques including methods, systems, and/or computer program products for implementing a spare data buffer in a memory are provided. An example method may include detecting, by a processor, a failed data buffer in a memory. The method may also include enabling, by the processor, the spare data buffer in the memory. The method may further include extending, by the processor, a buffer communication to the spare data buffer to enable the spare buffer to functionally replace the failed data buffer.

Additional features and advantages are realized through the techniques of the present disclosure. Other aspects are described in detail herein and are considered a part of the disclosure. For a better understanding of the present disclosure with the advantages and the features, refer to the following description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages thereof, are apparent from the following detailed description taken in conjunction with the accompanying drawings in which:

DETAILED DESCRIPTION

Figure 1:
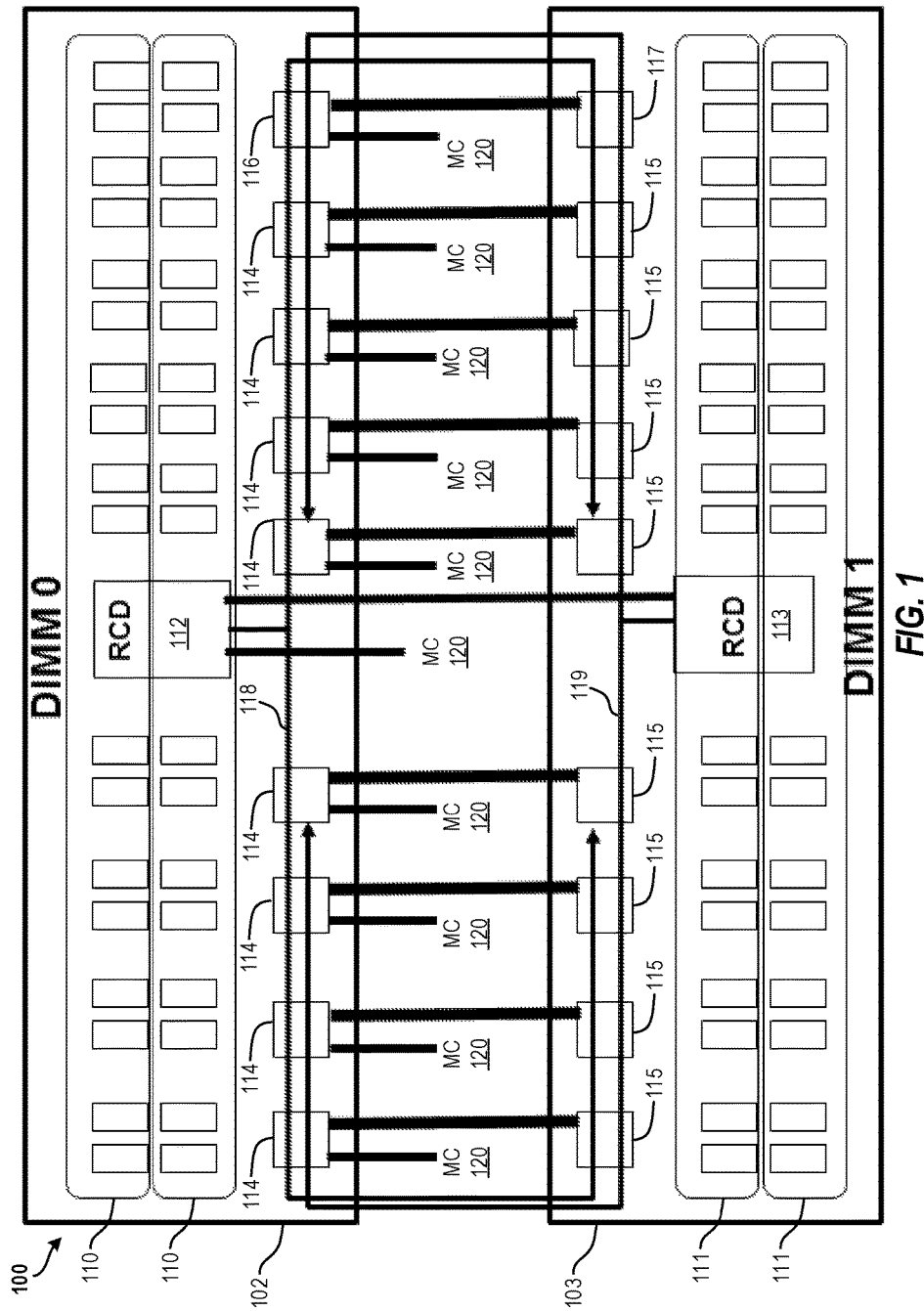
FIG. 1 illustrates a block diagram of a memory 100 according to examples of the present disclosure.

Various implementations are described below by referring to several examples of data buffer spare architectures for dual channel serial interface memory. In dual channel configurations, two dual in-line memory modules (DIMMs) may be used. The two DIMMs are connected by data channels. In some examples, the two DIMMs may be cascaded such that a first DIMM is connected to a memory controller, and the second DIMM is connected to the first DIMM (not the memory controller directly). Some types of memory, such as double data rate fifth-generation (DDR5) memory, utilize data buffers. However, if one of the data buffers fails, the bandwidth may be decreased, causing one of the DIMMs to be unusable.

By implementing a spare data buffer on each of the DIMMs, the problem of a data buffer going bad is solved. For example, if one of the data buffers goes bad, the spare data buffer may be initialized as a replacement to the bad data buffer. This enables the DIMM to continue to be usable and to support sufficient bandwidth.

Additionally, the data buffers may communicate using a buffer communication bus that connects the data buffers and a register clock driver (RCD). The RCD acts as an address and control buffer and generates command sequences to the data buffers. According to examples of the present disclosure, each DIMM in a dual DIMM configuration includes an RCD. If one of the RCDs fails, the other DIMM's RCD can manage the data buffers for both DIMMs. In this way, one of the RCDs acts as a spare or redundant RCD.

In some implementations, the present techniques provide fail safe mechanisms and improved row address strobe (RAS) features for memory based server architectures. The present techniques also utilize existing calibration and error-correcting code (ECC) mechanisms so that the calibration and ECC mechanisms do not change. The present techniques can be used with regular dual drop or even triple drop load reduced DIMM (LRDIMM) configurations. The command address bus of a DIMM can be "dotted" to two different buses instead of implementing daisy chaining to avoid inter DIMM failures and to save pin counts, input/output power, etc. These and other advantages will be apparent from the description that follows.

Example embodiments of the disclosure include or yield various technical features, technical effects, and/or improvements to technology. Example embodiments of the disclosure provide memory architectures configured to provide a fail-safe mechanism using a spare buffer. Example embodiments also provide for failover use of register clock driver from one DIMM to another in the case of RCD failure. These aspects of the disclosure constitute technical features that yield the technical effect of increasing memory reliability and bandwidth when a data buffer and/or RCD experience a failure. As a result of these technical features and technical effects, memory architectures in accordance with example embodiments of the disclosure represent improvements to existing memory technologies. It should be appreciated that the above examples of technical features, technical effects, and improvements to technology of example embodiments of the disclosure are merely illustrative and not exhaustive.

FIG. 1 illustrates a block diagram of a memory 100 according to examples of the present disclosure. In the example of FIG. 1, the memory 100 includes two dual in-line memory modules (DIMMs) 102, 103. It should be appreciated that the DIMMs 102, 103 may be register DIMMs (RDIMMs), load reduced DIMMs (LRDIMMs), or other types of DIMMs. Each of the DIMMs 102, 103 includes random access memory chips 110, 111 respectively for storing data.

Each of the DIMMs 102, 103 also includes data buffers 114, 115 respectively. The data buffers 114, 115 provide a temporary holding place for data that is being sent or received from an external device, such as a hard disk drive (HDD), keyboard or printer or between the memory chips 110, 111. In examples, such as illustrated in FIG. 1, each DIMM 102, 103 may include eight data buffers, although other numbers of data buffers may be implemented (e.g., 4, 6, 10, etc.).

Each of the DIMMs 102, 103 also includes a spare data buffer 116, 117 respectively. The spare data buffer 116, 117 is used when one of the data buffers 114, 115 fails. For example, if one of the data buffers 114 fails on DIMM 102, the spare data buffer 116 may be initialized and used as a spare (i.e., replacement) for the failed data buffer. Although not illustrated in FIG. 1, each of the DIMMs 102, 103 may also include an error-correcting code (ECC) buffer to detect and correct data errors.

Each of the data buffers 114, 115 is connected to a register clock driver (RCD) 112, 113 respectively. The RCDs 112, 113 acts as an address and control buffer and generates command sequences to the data buffers 114, 115 respectively using a buffer communication bus 118, 119. The buffer communication bus 118, 119 connects the data buffers 114, 115 to enable the data buffers 114, 115 to communicate with one another and with the RCDs 112, 113.

In the example of FIG. 1 in which the memory 100 uses a pair of DIMMs 102, 103, the data buffers 114 may be connected to one another and to a memory controller 120. For example, the DIMMs 102, 103 may be configured in a dual drop architecture. The DIMMs 102, 103 may be cascaded such that the data buffers 114 and the spare data buffer 116 of the DIMM 102 are connected to the memory controller 120. The data buffers 115 and the spare data buffer 117 of the DIMM 103 are connected to the respective data buffers 114 and the spare data buffer 116 of the DIMM 102.

The RCD 112 and/or the RCD 113 may also be connected to the memory controller 120. In the example of a cascading arrangement according to FIG. 1, the RCD 112 is connected to the memory controller 120 and the RCD 113 is connected to the RCD 112.

In the example of FIG. 1, dotting of the buffer communication bus 118, 119 occurs. In this way, the buffer communication bus 118, 119 acts as a shared buffer communication bus. For example, if one of the data buffers 114, 115 and/or the RCD 112, 113 fails, the data buffers may be able to continue to communicate to other channels. In this way, the dotting occurs and the buffer communication bus is extended between the DIMMs 102, 103. In one example, if the RCD 113 fails, the buffer communication bus 118 may be extended to the DIMM 103 to enable the DIMM 103 and its data buffers 115 to continue to function. To implement this functionality, additional pins may be implemented into the data buffers (e.g., 8 pins instead of 4 pins).

Figure 2:
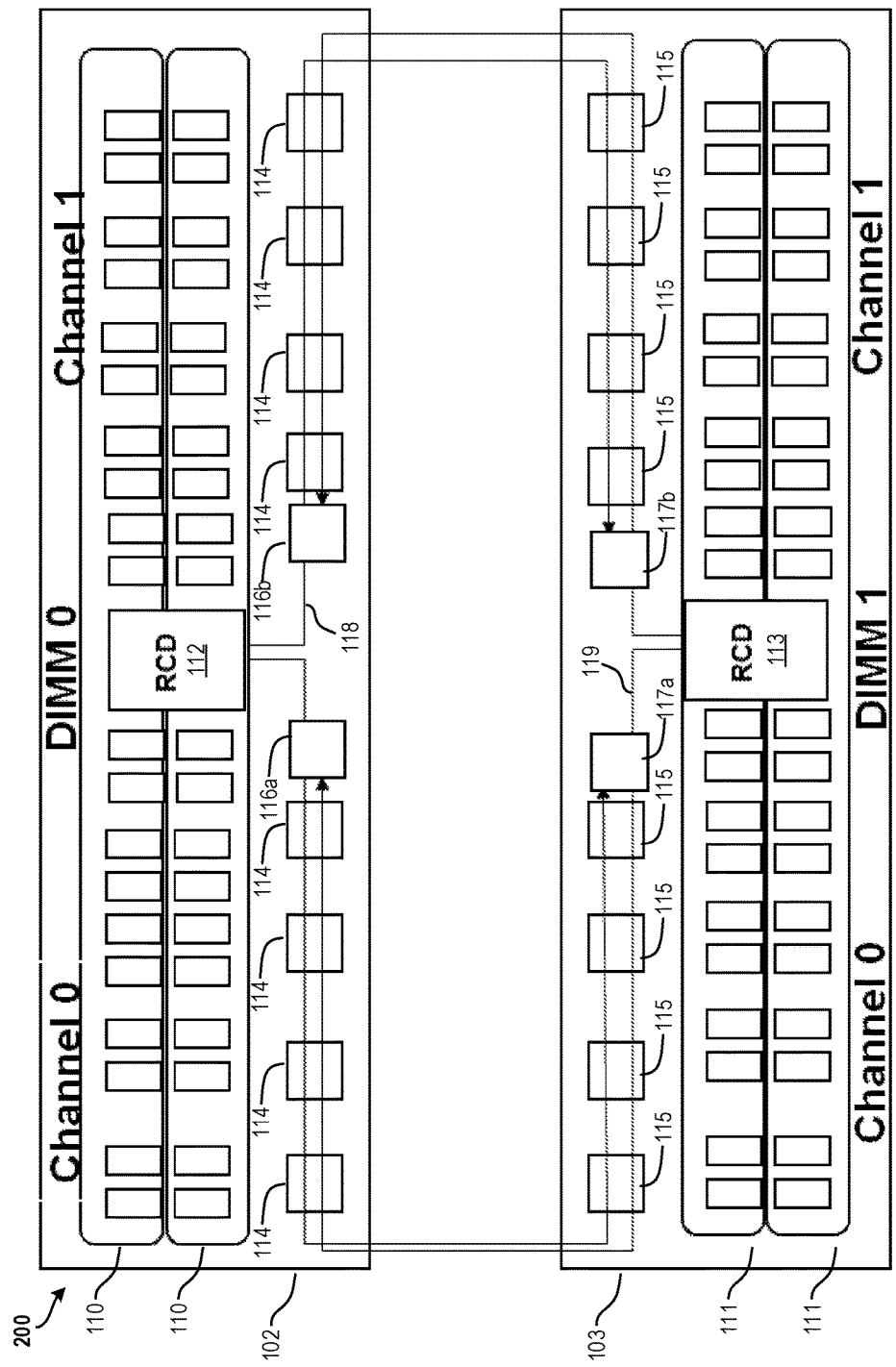
FIG. 2 illustrates a block diagram of another memory 200 according to examples of the present disclosure.

FIG. 2 illustrates a block diagram of another memory 200 according to examples of the present disclosure. FIG. 2 is described herein with reference to the elements of FIG. 1, except as otherwise noted. In the example of FIG. 2, the memory 100 includes two dual in-line memory modules (DIMMs) 102, 103. It should be appreciated that the DIMMs 102, 103 may be registered DIMMs (RDIMMs), load reduced DIMMs (LRDIMMs), or other types of DIMMs. Each of the DIMMs 102, 103 includes random access memory chips 110, 111 respectively for storing data.

Each of the DIMMs 102, 103 also includes data buffers 114, 115 respectively. The data buffers 114, 115 provide a temporary holding place for data that is being sent or received from an external device, such as a hard disk drive (HDD), keyboard or printer or between the memory chips 110, 111. In examples, such as illustrated in FIG. 1, each DIMM 102, 103 may include eight data buffers, although other numbers of data buffers may be implemented (e.g., 4, 6, 10, etc.).

Each of the DIMMs 102, 103 also include two spare data buffers. For example, the DIMM 102 includes spare data buffers 116a and 116b while the DIMM 103 includes spare data buffers 117a and 117b respectively. The spare data buffers 116a, 116b, 117a, 117b are used when one of the data buffers 114, 115 fails. For example, if one of the data buffers 114 fails on DIMM 102, the spare data buffer 116a may be initialized and used as a spare (i.e., replacement) for the failed data buffer. It should be appreciated that the use of two spare data buffers is useful in a dual channel memory configuration as illustrated in FIG. 2. In this way, each channel (channel 0 and channel 1) includes a spare data buffer in each DIMM. In the example of FIG. 2, the spare data buffer 116a corresponds to channel 0 of the DIMM 102 and the spare data buffer 116b corresponds to the channel 1 of the DIMM 102. The DIMM 103 similarly utilizes two spare data buffers 117a, 117b for each of channel 0 and channel 1 respectively. Although not illustrated in FIG. 1, each of the DIMMs 102, 103 may also include an error-correcting code (ECC) buffer to detect and correct data errors.

Each of the data buffers 114, 115 is connected to a register clock driver (RCD) 112, 113 respectively. The RCDs 112, 113 acts as an address and control buffer and generates command sequences to the data buffers 114, 115 respectively using a buffer communication bus 118, 119. The buffer communication bus 118, 119 connects the data buffers 114, 115 to enable the data buffers 114, 115 to communicate with one another and with the RCDs 112, 113.

In the example of FIG. 2 in which the memory 100 uses a pair of DIMMs 102, 103, the data buffers 114 may be connected to one another and to a memory controller (not shown in FIG. 2). For example, the DIMMs 102, 103 may be configured in a dual drop architecture. The DIMMs 102, 103 may be cascaded such that the data buffers 114 and the spare data buffer 116 of the DIMM 102 are connected to the memory controller 120. The data buffers 115 and the spare data buffer 117 of the DIMM 103 are connected to the respective data buffers 114 and the spare data buffer 116 of the DIMM 102.

The RCD 112 and/or the RCD 113 may also be connected to the memory controller. In the example of a cascading arrangement according to FIG. 2, the RCD 112 is connected to the memory controller 120 and the RCD 113 is connected to the RCD 112.

In the example of FIG. 1, dotting of the buffer communication bus 118, 119 occurs. In this way, the buffer communication bus 118, 119 acts as a shared buffer communication bus. For example, if one of the data buffers 114, 115 and/or the RCD 112, 113 fails, the data buffers may be able to continue to communicate to other channels. In this way, the dotting occurs and the buffer communication bus is extended between the DIMMs 102, 103. In one example, if the RCD 113 fails, the buffer communication bus 118 may be extended to the DIMM 103 to enable the DIMM 103 and its data buffers 115 to continue to function. To implement this functionality, additional pins may be implemented into the data buffers (e.g., 8 pins instead of 4 pins).

Figure 3:
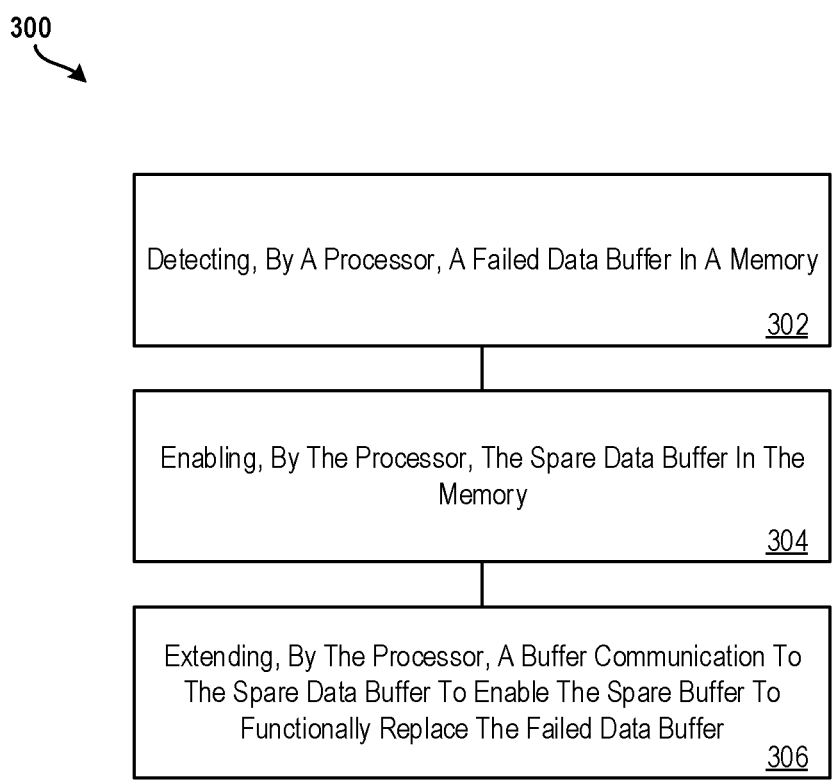
FIG. 3 illustrates a method for implementing a spare data buffer in a memory according to examples of the present disclosure.

FIG. 3 illustrates a flow diagram of a method 300 for implementing a spare data buffer in a memory according to examples of the present disclosure. Reference is made to FIGS. 1 and 2 in describing the method 300.

At block 302, the method 300 includes detecting, by a processor, a failed data buffer (e.g., the data buffer 114) in a memory (e.g., the memory 100).

At block 304, the method 300 includes enabling, by the processor, the spare data buffer (e.g., the spare data buffer 116) in the memory. In examples, the memory includes a first dual in-line memory module (DIMM) (e.g., the DIMM 102) and a second DIMM (e.g., the DIMM 103). The first DIMM may include a first plurality of data buffers and at least one first spare data buffer, and the second DIMM may include a second plurality of data buffers and at least one second spare data buffer.

According to aspects of the present disclosure, the first DIMM includes a first plurality of data buffers and at least one first spare data buffer, and the second DIMM includes a second plurality of data buffers and at least one second spare data buffer. In such examples, the failed data buffer may be one of the data buffers of the first plurality of data buffers or the second plurality of data buffers.

At block 306, the method 300 includes extending, by the processor, a buffer communication (e.g., the buffer communication bus 118) to the spare data buffer to enable the spare buffer to functionally replace the failed data buffer. In examples, the first plurality of data buffers, the second plurality of data buffers, the first spare data buffer, and the second spare data buffer are communicatively coupled together via a buffer communication bus.

In yet additional examples, the first DIMM includes a first register clock driver, and the second DIMM includes a second register clock driver. In such cases, the method 300 may further include detecting, by the processor, that one of the first register clock driver or the second register clock driver failed. The method 300 may then additionally include extending, by the processor, the buffer communication to the other of the first register clock driver or the second register clock driver that did not fail.

Additional processes also may be included, and it should be understood that the processes depicted in FIG. 3 represent illustrations, and that other processes may be added or existing processes may be removed, modified, or rearranged without departing from the scope and spirit of the present disclosure.

Figure 4:
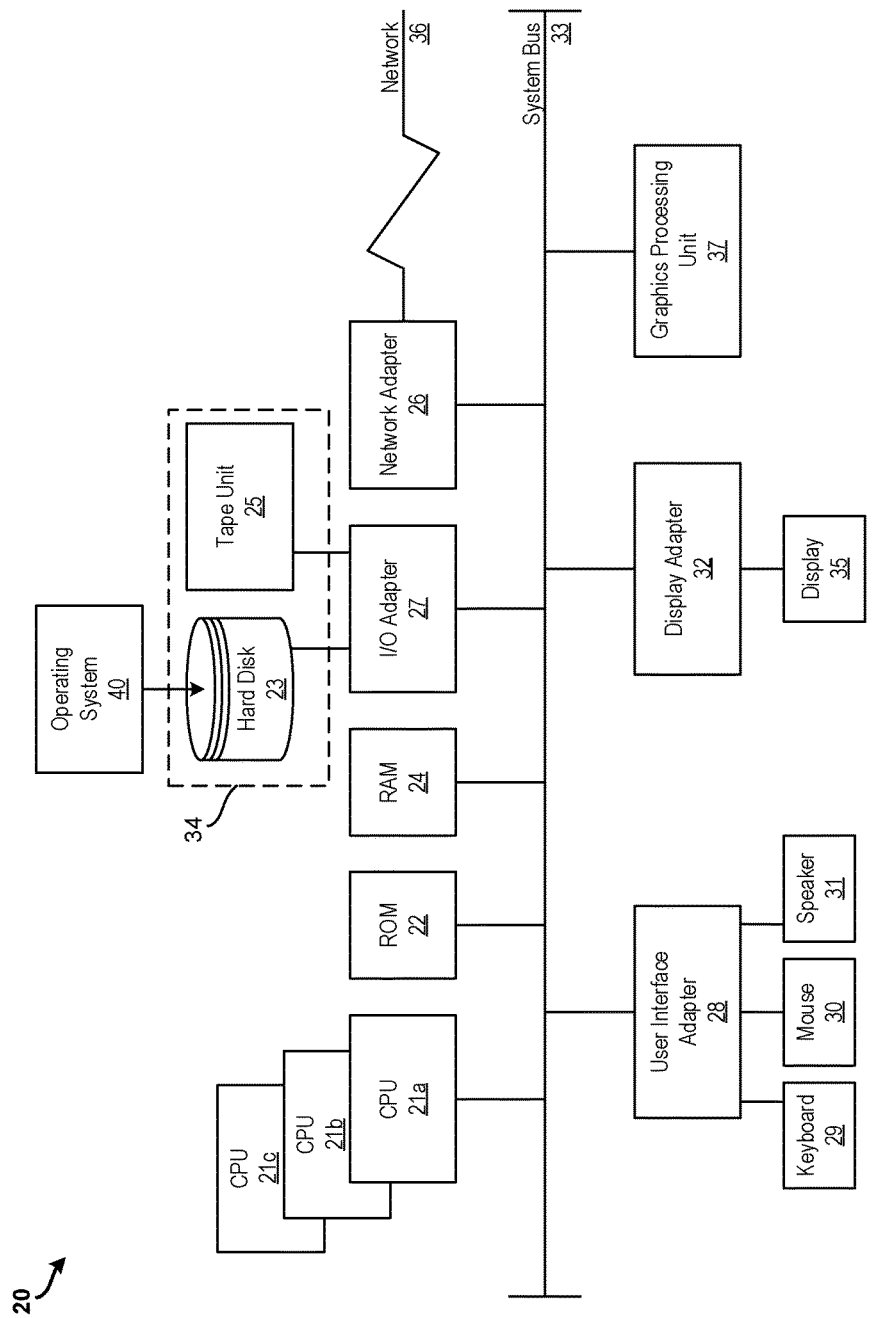
FIG. 4 illustrates a block diagram of a processing system for implementing the techniques described herein according to examples of the present disclosure.

It is understood in advance that the present disclosure is capable of being implemented in conjunction with any other type of computing environment now known or later developed. For example, FIG. 4 illustrates a block diagram of a processing system 20 for implementing the techniques described herein. In examples, processing system 20 has one or more central processing units (processors) 21a, 21b, 21c, etc. (collectively or generically referred to as processor(s) 21 and/or as processing device(s)). In aspects of the present disclosure, each processor 21 may include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and may include a basic input/output system (BIOS), which controls certain basic functions of processing system 20.

Further illustrated are an input/output (I/O) adapter 27 and a communications adapter 26 coupled to system bus 33. I/O adapter 27 may be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 20 may be stored in mass storage 34. A network adapter 26 interconnects system bus 33 with an outside network 36 enabling processing system 20 to communicate with other such systems.

A display (e.g., a display monitor) 35 is connected to system bus 33 by display adaptor 32, which may include a graphics adapter to improve the performance of graphics intensive applications and a video controller. In one aspect of the present disclosure, adapters 26, 27, and/or 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 may be interconnected to system bus 33 via user interface adapter 28, which may include, for example, a Super I/O chip integrating multiple device adapters into a single integrated circuit.

In some aspects of the present disclosure, processing system 20 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing, and has a highly parallel structure that makes it more effective than general-purpose CPUs for algorithms where processing of large blocks of data is done in parallel.

Thus, as configured herein, processing system 20 includes processing capability in the form of processors 21, storage capability including system memory (e.g., RAM 24), and mass storage 34, input means such as keyboard 29 and mouse 30, and output capability including speaker 31 and display 35. In some aspects of the present disclosure, a portion of system memory (e.g., RAM 24) and mass storage 34 collectively store an operating system such as the AIX® operating system from IBM Corporation to coordinate the functions of the various components shown in processing system 20.

The present techniques may be implemented as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some examples, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to aspects of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various examples of the present disclosure have been presented for purposes of illustration, but are not intended to be exhaustive or limited to the embodiments disclosed. Many modifications and variations will be apparent to those of ordinary skill in the art without departing from the scope and spirit of the described techniques. The terminology used herein was chosen to best explain the principles of the present techniques, the practical application or technical improvement over technologies found in the marketplace, or to enable others of ordinary skill in the art to understand the techniques disclosed herein.

What is claimed is:

1. A computer-implemented method for implementing a spare data buffer in a memory comprising a first dual-inline memory module (DIMM) and a second DIMM, the method comprising:

detecting, by a processor, a failed data buffer in the first DIMM of the memory, wherein the first DIMM comprises a first plurality of data buffers, and wherein the failed data buffer is one of the first plurality of data buffers;

enabling, by the processor, the spare data buffer in the first DIMM, wherein the spare data buffer is another one of the first plurality of data buffers; and extending, by the processor, a buffer communication bus to the spare data buffer to enable the spare buffer to functionally replace the failed data buffer, wherein the first DIMM comprises the first plurality of data buffers and at least one first spare data buffer, wherein the second DIMM comprises a second plurality of data buffers and at least one second spare data buffer, wherein the first DIMM comprises a first register clock driver, and wherein the second DIMM comprises a second register clock driver.

* * * * *